(12) United States Patent
Lam et al.

(10) Patent No.: US 8,417,880 B2
(45) Date of Patent: Apr. 9, 2013

(54) SYSTEM FOR NAND FLASH PARAMETER AUTO-DETECTION

(75) Inventors: Chi Ho Lam, Hong Kong (HK); Ka Leung Ho, Hong Kong (HK)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 246 days.

(21) Appl. No.: 12/916,652

(22) Filed: Nov. 1, 2010

(65) Prior Publication Data

US 2012/0110241 A1    May 3, 2012

(51) Int. Cl.
*G06F 13/00* (2006.01)

(52) U.S. Cl.
USPC ............ 711/103; 711/118; 711/144; 711/154

(58) Field of Classification Search .................. 711/103, 711/118, 144, 154
See application file for complete search history.

(56) References Cited

U.S. PATENT DOCUMENTS

| | | | |
|---|---|---|---|
| 6,026,027 A | 2/2000 | Terrell, II et al. | |
| 6,629,207 B1 * | 9/2003 | Yoshioka et al. | 711/125 |
| 7,493,447 B2 | 2/2009 | Chuang | |
| 7,657,696 B2 | 2/2010 | Su et al. | |
| 2007/0067520 A1 | 3/2007 | Maddali et al. | |
| 2008/0288715 A1 | 11/2008 | Maddali et al. | |

* cited by examiner

*Primary Examiner* — Reba I Elmore
(74) *Attorney, Agent, or Firm* — Ella Cheong Hong Kong; Sam T. Yip

(57) ABSTRACT

A system comprising a NAND flash memory device having a multiplicity of parameters; a flash controller configured to perform a NAND flash memory parameter automatic detection process including reading a device identifier of the NAND flash memory device and proceeding if a valid device identifier value is returned, detecting an address cycle and a block type of the NAND flash memory device, detecting a page size of the NAND flash memory device, detecting a spare size of the NAND flash memory device, detecting a memory size of the NAND flash memory device, and detecting a block size of the NAND flash memory device.

20 Claims, 12 Drawing Sheets

SYSTEM FOR NAND FLASH PARAMETER AUTO-DETECTION

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates generally to electronic memory storage devices, and more specifically to flash memory wherein the interface parameters of flash based memory devices vary based on the capacity, model and make. Still more specifically, the present invention relates to the automatic detection and reading of the interface parameters of a NAND flash memory device.

BACKGROUND

Flash memory is a type of non-volatile electronic data storage circuitry that can be electronically programmed to hold data and be erased repeatedly, thus well suitable as a rewritable data storage medium used in electronics and computer systems. NAND flash memory is a special type of flash memory that uses floating-gate transistors connected serially in a NAND gate fashion. The NAND flash memory technology is widely used in computer systems, digital cameras, portable music players, USB flash drives, memory cards, and SmartMedia™ cards.

NAND flash memories come in different capacities and electronic architectures depending on the manufacture, model, and technology used. For example, memory banks in a NAND flash memory device are arranged into blocks with sizes including but not limited to 16K, 128K, 256K, or 512K bytes. Each block is further organized into pages. The number of pages can be 32, 64, 128, or more with each page having a possible size of 256, 512, 1K, 2K, or 4K bytes. Other technical variations arise in other attributes such as block type, address cycles, and size of spare memory space.

In order to communicate with a NAND flash memory device, the aforementioned electronic characteristics of the NAND flash memory device must be known to the host system. These electronic characteristics become the interface parameters of a particular NAND flash memory device of a particular capacity, model and make coupled to the host system typically through a flash controller component. Thus, the flash controller component interfacing the NAND flash memory device must have knowledge of the NAND flash memory device's interface parameters including its address cycle, block type, page size, spare size, memory size, and block size.

Under the current state of technology, a typical electronic or computer system must store, in a separate memory, multiple sets of NAND flash memory interface parameter values of different manufactures and models that are supported. Upon the coupling of a NAND flash memory device, the matching set of interface parameter values is loaded into its flash controller. For this reason, system boot instruction codes necessary in initializing a computer processor cannot be stored in NAND flash based memory.

One solution to the above problem is to pre-configure the flash controller with a pre-defined set of NAND flash memory interface parameter values. However, the drawback is that only one manufacture and type of NAND flash memory will be accepted by the host system, or at least the pre-configured flash controller.

In the business of mass production of consumer electronics, it is particularly problematic for the manufacturing assembly lines to match the exact makes and models of NAND flash memories to voluminous product items, which can come in many different configurations with components sourced from many different suppliers. If the NAND flash interface parameters can be automatically detected, then multiple makes and/or models of NAND flash memories, regardless the differences in their interface parameters, can be paired with a flash controller without any pre-configuration.

The U.S. Patent Application Publication No. US 2008/0288715 discloses a method of hardware implementable NAND flash memory page size automatic detection and another method of software implementable detection. However, the disclosed hardware method, based on the difference in access protocol, can only estimate whether the page size is less than or equal 512 bytes or otherwise; and the disclosed software method relies on the use of automatic detection markers, which are small pieces data that are written to specific locations in the memory space of the NAND flash memory during manufacture at the manufacturer's discretion. Therefore, the NAND flash memory must be new in order for this software method to work.

The U.S. Pat. No. 7,657,696 also discloses a method for automatically detecting a plurality of parameters for a NAND flash memory. However, the U.S. Pat. No. 7,657,696 describes the detection of only some of the NAND flash memory parameters such as address cycle and page size without addressing other interface parameters necessary in facilitating a communication session with full range of functionality with a NAND flash memory device.

In the U.S. Patent Application Publication No. 2007/0067520, although a general flow of NAND flash parameters detection is described, it does not provide any specific methodology or mechanism for determining the interface parameter values of NAND flash memories of different manufacture and model.

Another problem associated with using flash memory to store system boot instruction codes is the operating speed mismatch between the computer processor and the flash memory. A typical computer processor can execute instructions far faster than a flash memory can retrieve and feed the processor the boot instruction codes stored in it, resulting in wasteful processor waiting cycles.

In order to narrow the operating speed difference between the computer processor and the flash memory, many system designs employ a cache hierarchy where a faster memory technology is used as intermediate data or instruction cache. One such design is include a bank of static random access memory (SRAM) in the flash controller. Because SRAM is costly and has much lower memory density, it is typical that only a relatively small amount is incorporated.

When the system boot instruction codes exceed the cache in size, the instruction codes can only be partially cached. It leads to the question of which part of the instruction codes should be cached at any point of time during the code execution. The U.S. Pat. No. 6,026,027 discloses an electronic memory system having a semi-permanent memory storage, a memory device for rapid data transfer and temporary memory storage, and controller for monitoring and controlling writes to the semi-permanent memory storage. In one of its examples, a flash memory and SRAM is used as the semi-permanent memory storage and the temporary memory storage respectively. This arrangement tends to increase the effective operational bandwidth of an implementation of flash memory; but the simplicity of its cache management process, in which data is read from cache only when the data is in the cache, the full potential benefit of a caching hierarchy is not realized.

A more advance cache management system is presented in the U.S. Pat. No. 7,493,447. The disclosed cache management system provides a sort of prediction for sequential program code such that the soon-to-be-executed instructions will be cached. However, the prediction is dependent on the type of instruction code branching or jumping, thus the cache management system is specific to the types of computer processor.

SUMMARY

It is an objective of the presently claimed invention to provide a method and a system for automatic detection and reading of the interface parameters of a NAND flash memory device of any memory capacity, model, and make without any prior pre-programming or pre-definition of the interface parameter values.

It is a further objective of the presently claimed invention to enable the use of NAND flash memory to store and provide the system boot instruction codes to a computer processor during system start up, eliminating the need for an additional separate memory in the system.

It is a further objective of the presently claimed invention to improve the system start up speed of a computer processor accessing the system boot instructions stored in NAND flash memory by reducing the access time with the use of a code prediction algorithm that is CPU-independent.

In accordance with various embodiments of the presently claimed invention, the NAND flash parameter automatic detection process comprises of the detection of address cycle and block type, the detection of page size, the detection of spare size, the detection of memory size, and the detection of block size of the target NAND flash memory device in the above particular order.

The detection of address cycle and block type includes the steps of issuing read commands and certain number of bytes of memory address to the target NAND flash memory device, monitoring the busy signal from the target NAND flash memory device, and determining the address cycle and block type based on the number of bytes of memory address have been issued before the busy signal is received. The block type can be large or small, and the address cycle can be three, four, or five.

The detection of page size begins with reading a number of bytes of data at the beginning of a page, then repeating a data read operation of the same number of bytes of data at a column address that is two times its previous value until the data read matches the data read at the beginning of the page. The same data is read because once the column address issued to the target NAND flash memory device is pointing to a column address that is a multiple of the size of the page, it will loop around and point back to the beginning of the page for the data reading. Consequently the page size is determined.

The detection of spare size includes the steps of first reading a number of bytes of data at the beginning of the spare memory space of a page. The spare memory space can be accessed by pointing to a column address that is beyond the end of the page's main memory space.

For small block type NAND flash memory device, the spare size can be found by performing a repeating data read operation at incrementing column addresses starting at a column address that is the sum of the minimum supported spare size and the page size minus one unit of memory address. By incrementing the column address for each data read by one unit of memory address, the end of the spare memory address space will eventually be reached. At this point, data from the page's main memory space is returned and the busy signal is provided. Consequently the size of the spare memory space can be determined by summing the total column address increments from the first data read column address location and the minimum supported spare size.

For large block type NAND flash, a number of bytes of specific data pattern are first written to the spare memory space at a column address that is the sum of the minimum supported spare size and the page size minus one unit of memory address, then a repeating data read operation at incrementing column addresses is performed. By incrementing the column address by one unit of memory address for each data read, the end of the spare memory space will eventually be reached, and the data read will not match the initial data written to the spare memory space. Consequently the size of the spare memory space can be determined by summing the total column address increments from the first data read column address location and the minimum supported spare size.

The detection of memory size involves first reading data from a page at a column address equals to 0x00 for a small block type NAND flash memory device, 0x0000 for a large block type NAND flash memory device, and a row address equals to 0x100000 for a small block type NAND flash memory device with a four address cycle, 0x1000 for three address cycle, 0x010000 for a large block type NAND flash memory device. Then a page check routine is executed.

Depending on the outcome of the page check routine, either a repeating page read operation at decrementing row addresses or a repeating page read operation at incrementing row addresses is performed. In the former case, the page check routine is executed again after each page read operation. When the page check routine returns a match, the repetition is stopped and the memory size is the result of multiplying the final row address by the page size. In the latter case, the page check routine is executed after each page read operation. When the page check routine returns a mismatch, the repetition is stopped and the memory size is the result of multiplying two times the final row address by the page size.

The detection of block size includes the steps of first writing a number of bytes of data to the NAND flash memory device at the column address zero and a row address that is the minimum supported block size, then repeating the writing of the same number of bytes of data at the column address zero and a row address that is two times its previous value until the row address equals to the result of the memory size divided by the page size.

The next step is issuing a block erase command to the NAND flash memory device at the column address zero and the row address zero. Finally, repeating a read data operation of the same number of bytes of data at the column address zero and a row address that is two times its previous value until a non-empty data is returned. The block size, then, equals to the final row address.

One aspect of the presently claimed invention enables system boot instructions for a computer processor to be stored and retrieved from a NAND flash memory device because its interface parameters can be detected by a flash controller automatically using the presently claimed NAND flash parameter automatic detection process.

In accordance to another aspect of the presently claimed invention, the system boot instruction codes can be pre-loaded and cached in a flash controller's internal random access memory (RAM) for faster delivery to a computer processor during system start up. Because the system boot instruction codes are typically larger in size than the flash memory controller's internal RAM, only a sub-set of the system boot instruction codes is cached at any point of time. The presently claimed code prediction algorithm makes a prediction of which sub-set of the system boot instruction codes will be executed next and pre-fetches such sub-set into the cache replacing the currently occupying codes that are least recently used or least frequently used. Specifically, the cache is partitioned into pages, each is loaded with a section of the system boot instruction codes. The section that is under current execution will then request the flash memory controller to pre-fetch and load into other cache partitions other sections that will be executed imminently. Only a partition containing a section of boot instruction codes that is not under current execution will be replaced.

BRIEF DESCRIPTION OF THE DRAWINGS

Embodiments of the invention are described in more detail hereinafter with reference to the drawings, in which.

DETAILED DESCRIPTION

In the following description, systems and methods of automatically detecting NAND flash memory parameters and code prediction for caching system boot instructions are set forth as preferred examples. It will be apparent to those skilled in the art that modifications, including additions and/or substitutions may be made without departing from the scope and spirit of the invention. Specific details may be omitted so as not to obscure the invention; however, the disclosure is written to enable one skilled in the art to practice the teachings herein without undue experimentation.

Figure 3:
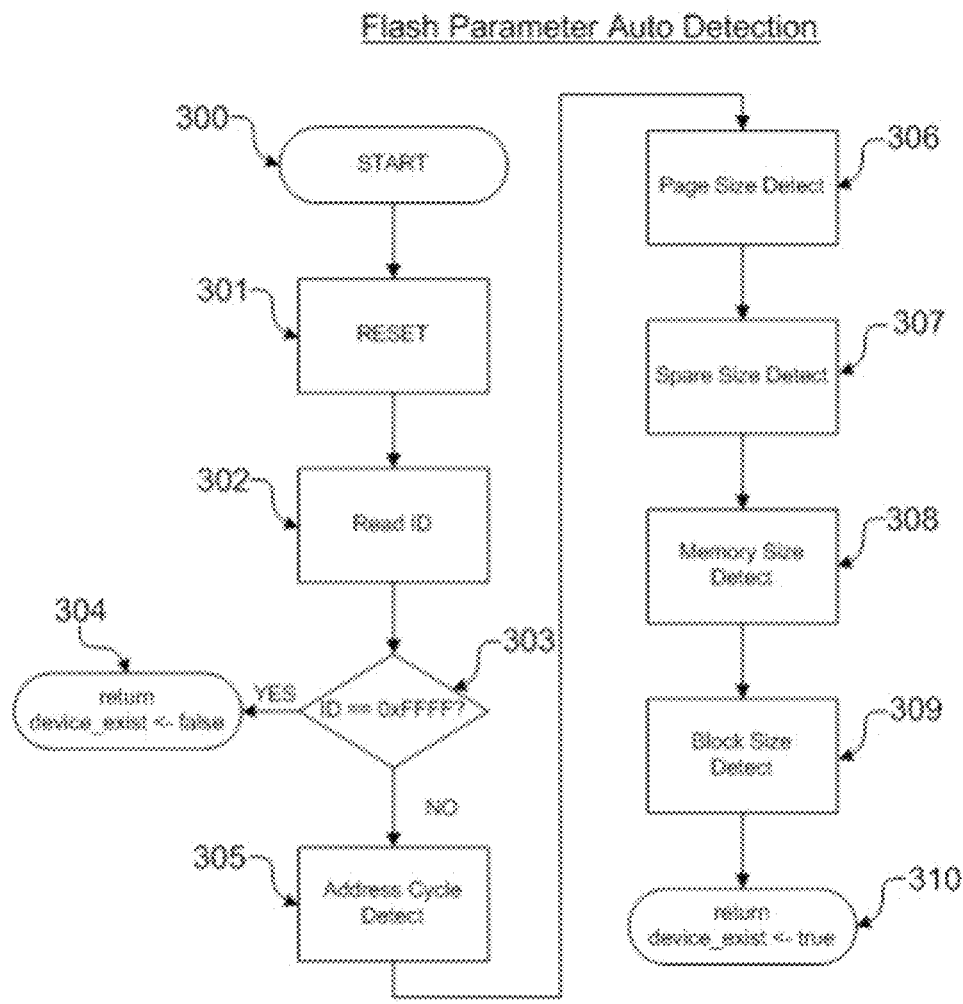
FIG. 3 shows a process flow diagram illustrating the high-level process steps of the NAND flash parameter automatic detection.

Referring to FIG. 3. The NAND flash parameter automatic detection process includes a first step 301: resetting the flash controller. Then step 302: the flash controller attempting to read the device identifier of the connected NAND flash memory device by issuing a read ID flash memory command and only proceeding if a valid device identifier value, a value other than 0xFFFF, is returned in step 303. This is to ensure a valid NAND flash memory device is connected. In this case, the flash controller continues to detecting the address cycle, including the block type, in step 305, the page size in step 306, the spare size in step 307, the memory size in step 308, and the block size in step 309, of the connected NAND flash memory device.

Figure 4:
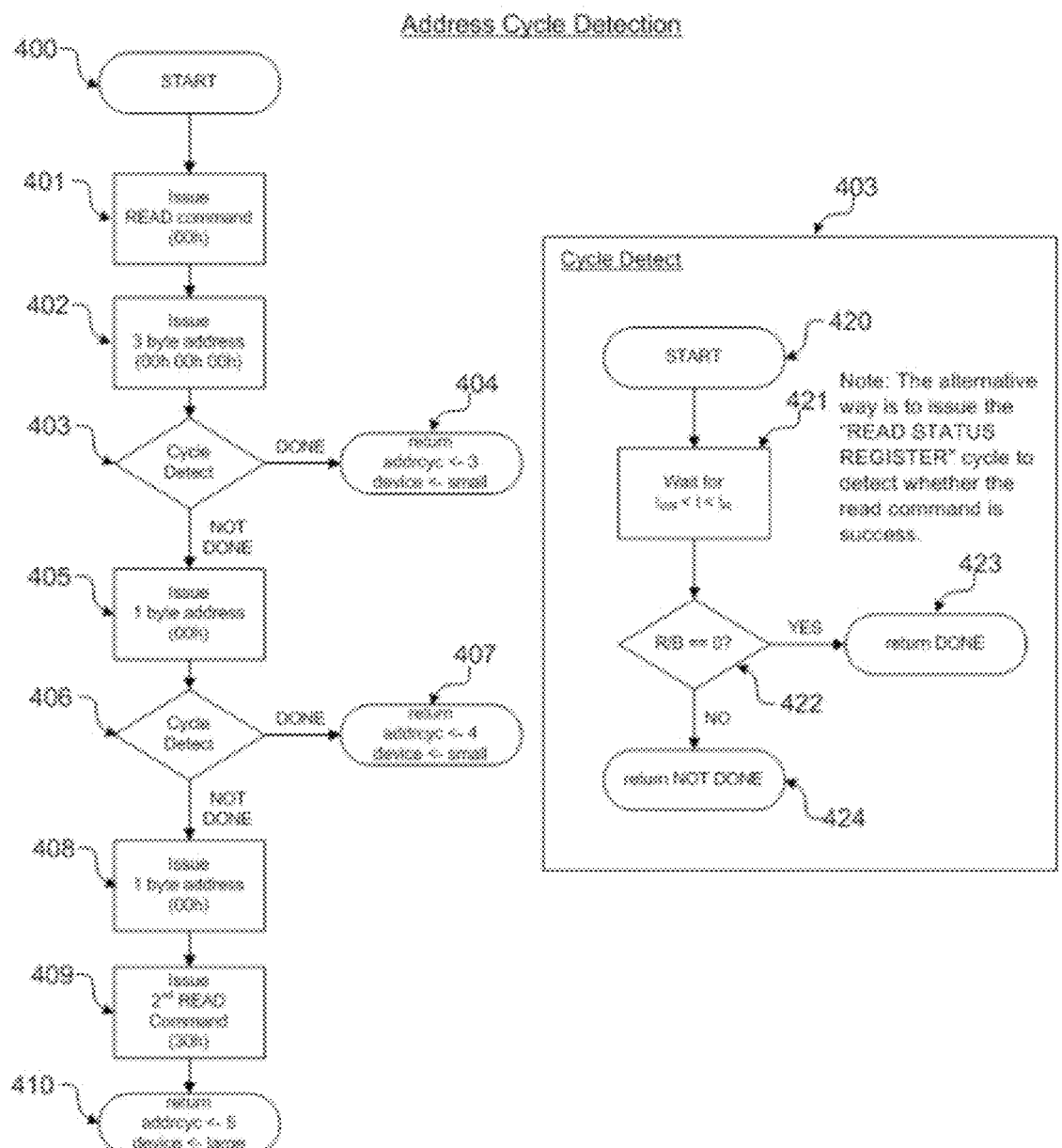
FIG. 4 shows a process flow diagram illustrating the process steps of the address cycle detection of the NAND flash parameter automatic detection.

FIG. 4 depicts the sub-process of detecting the address cycle and block type of the connected NAND flash memory device. This sub-process comprises step 401: issuing a first read command, 0x00, to the NAND flash memory device; step 402: issuing three address bytes of 0x00, 0x00, and 0x00 to the NAND flash memory device; step 403: detecting the address cycle that includes monitoring a busy signal from the NAND flash memory device for a wait time period (t) of not less than a minimum wait time ($t_{WB}$) and not more than a maximum wait time ($t_R$); step 404: if the busy signal is received (R/B=0) within the wait time period (t), recording three for the address cycle and small for the block type; otherwise, proceeding with step 405: issuing one more address byte of 0x00 to the NAND flash memory device; step 406: detecting the address cycle that includes monitoring a busy signal from the NAND flash memory device for a wait time period (t) of not less than a minimum wait time ($t_{WB}$) and not more than a maximum wait time ($t_R$); step 407: if the busy signal is received (R/B=0) within the wait time period (t), recording four for the address cycle and small for the block type; otherwise, proceeding with step 408: issuing one more address byte 0x00 to the NAND flash memory device; step 409: issuing a second read command, 0x30, to the NAND flash memory device, and finally in step 410: recording five for the address cycle and large for the block type.

Figure 5:
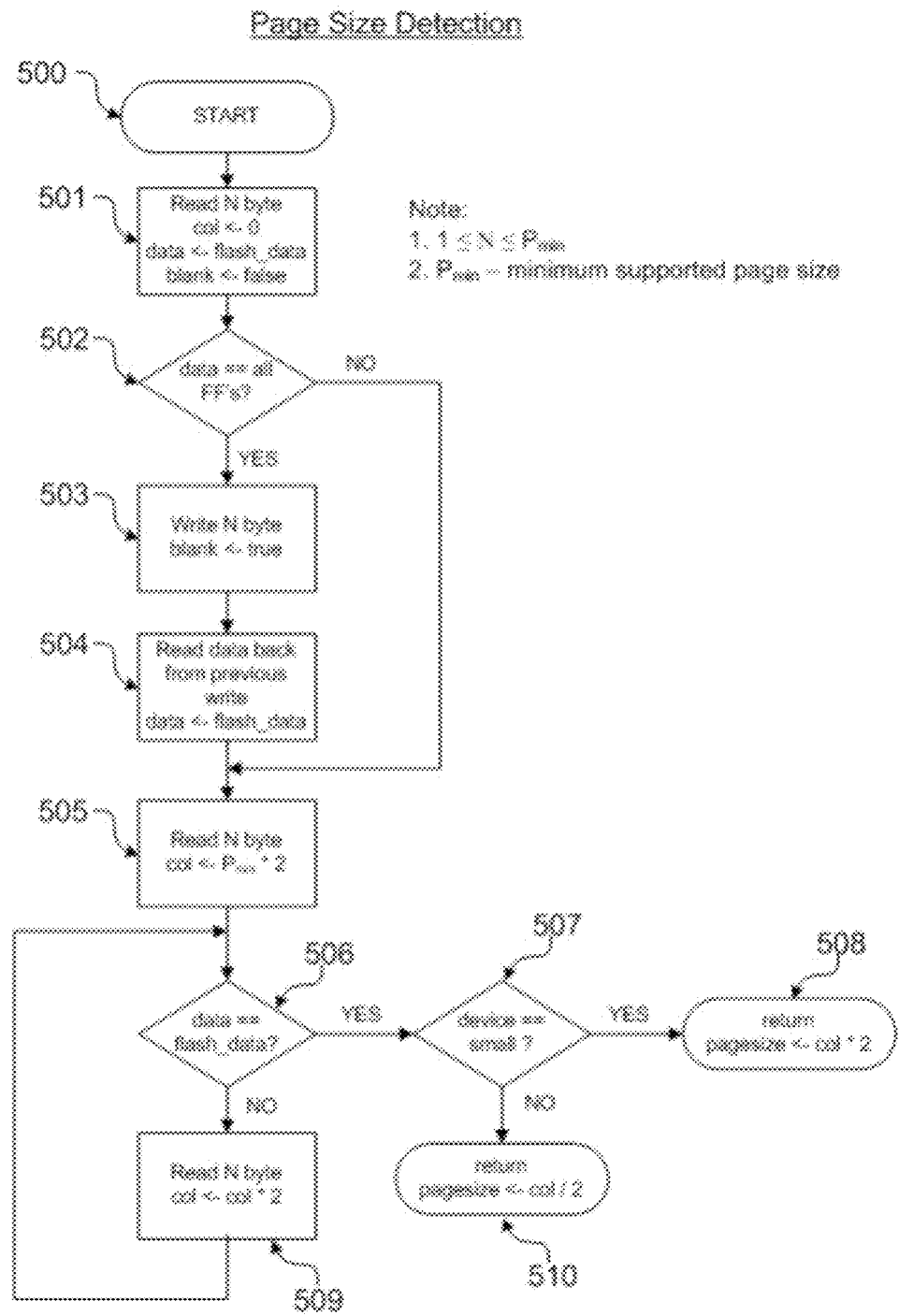
FIG. 5 shows a process flow diagram illustrating the process steps of the page size detection of the NAND flash parameter automatic detection.

FIG. 5 depicts the sub-process of detecting a page size of the NAND flash memory device. This sub-process comprises step 501: reading a N number of bytes of data from beginning of a page starting into a temporary data holder, wherein the beginning of a page is accessed by pointing to column address zero (0x00), and wherein N can be a number between 1 and the minimum supported page size ($P_{min}$) inclusive; step 502: if the temporary data holder is not holding empty data values (all 0xFF), then skipping to step 505; otherwise continuing with step 503: recording that the NAND flash memory device is blank, and writing N number of bytes of random data to the page; step 504: reading the same number of bytes of data from the same location into the temporary data holder; step 505: assigning a column address counter initially to two times of a minimum supported page size ($P_{min}$), and reading the N number of bytes of data from the page starting at a column address that is equal to the column address counter and in step 506: comparing with data in the temporary data holder; if they are same, then proceeding to steps 507, 508, and 510: recording the two times the column address counter value as the page size if the block type is small and recording the first column address counter value divided by two as the page size if the block type is large; otherwise, proceeding to step 509: doubling the column address counter, reading the N number of bytes of data from the page starting at the column address that is equal to the column address counter, and repeating from step 506 onward.

Figure 6:
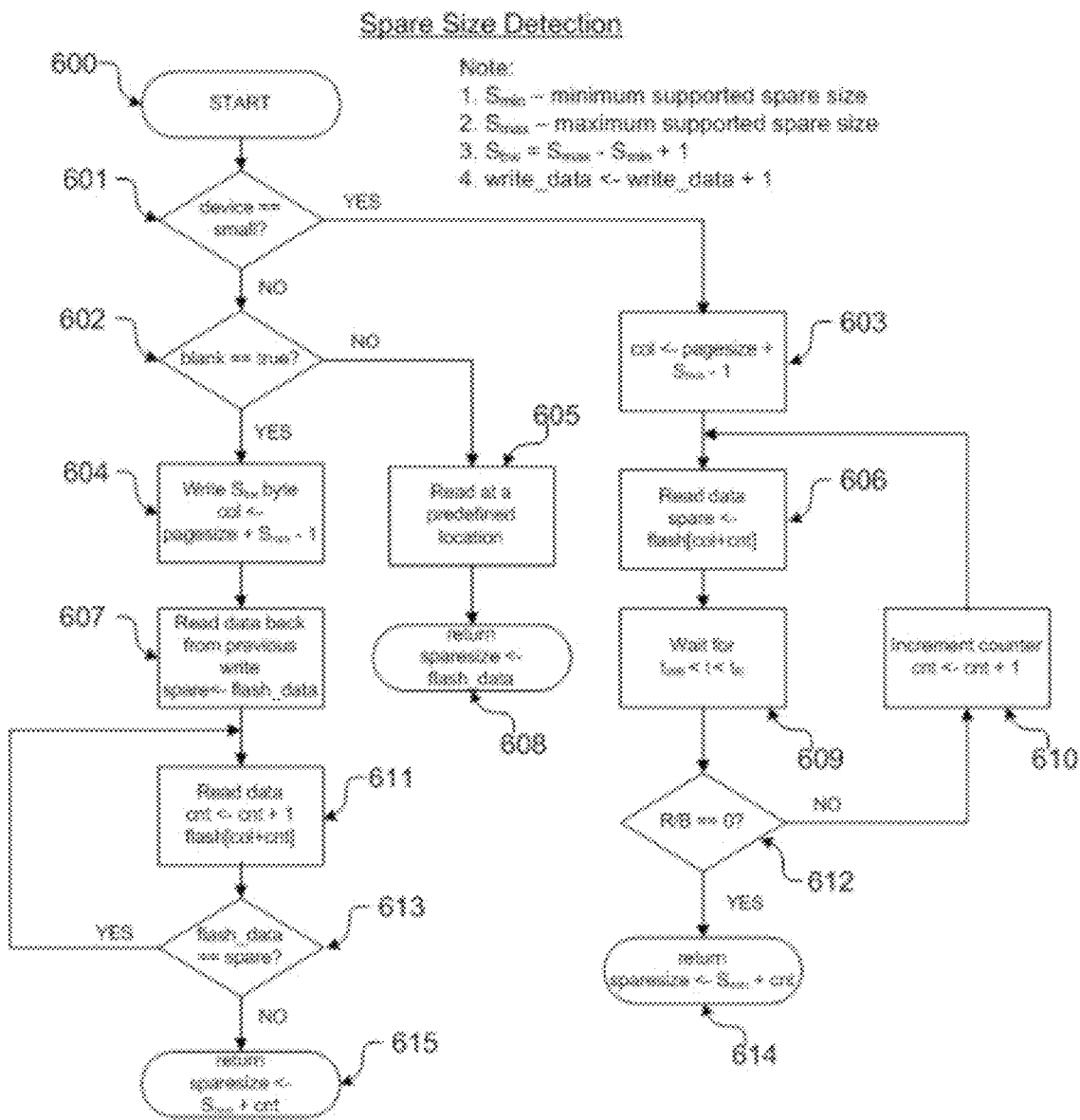
FIG. 6 shows a process flow diagram illustrating the process steps of the spare size detection of the NAND flash parameter automatic detection.

Referring to FIG. 6. Detecting a spare size of the NAND flash memory device comprises step 601: deciding on the execution path based on the block type of the NAND flash memory device; if the block type is small, then executing the following branch starting with step 603: assigning a column address counter initially to the page size plus a minimum supported spare size ($S_{min}$) minus one unit of memory address; step 606: reading a byte of data from the page starting at the column address that is equal to the column address counter; steps 609 and 612: monitoring the busy signal from the NAND flash memory device for the wait time period (t) of no less than the minimum wait time ($t_{WB}$) and no more than the maximum wait time ($t_R$); if the busy signal is received (R/B=0) within the wait time period (t), recording the column address counter minus the page size plus one unit of memory address as the spare size in step 614; otherwise if the busy signal is not received within the wait time period (t), incrementing the column address counter by one unit of memory address and repeating from step 606 onward. On the other hand, if the block type is large and the NAND flash memory device is not blank, executing the following branch starting with step 605: recording an extracted flash data read at a predefined memory location of the NAND flash memory device as the spare size. If the block type is large and if the NAND flash memory device is blank, then executing the following branch starting with step 604: assigning a column address counter initially to the page size plus a minimum supported spare size ($S_{min}$) minus one unit of memory address, and writing a $S_{bw}$ number of bytes of random data to a page starting at the column address that is equal to the column address counter, wherein $S_{bw}$ equals to the maximum supported spare size ($S_{max}$) minus the minimum supported spare size ($S_{min}$) plus one unit of memory address; step 607: reading back the data just written into a temporary data holder; step 611: incrementing the column address counter by one unit of memory address, and reading a byte from the page starting at the column address that is equal to the column address counter; step 613: comparing with the corresponding byte in the temporary data holder; if they are same, then step 615: recording the column address counter minus the page size plus one unit of memory address as the spare size; otherwise, repeating from step 611 onward.

Figure 7:
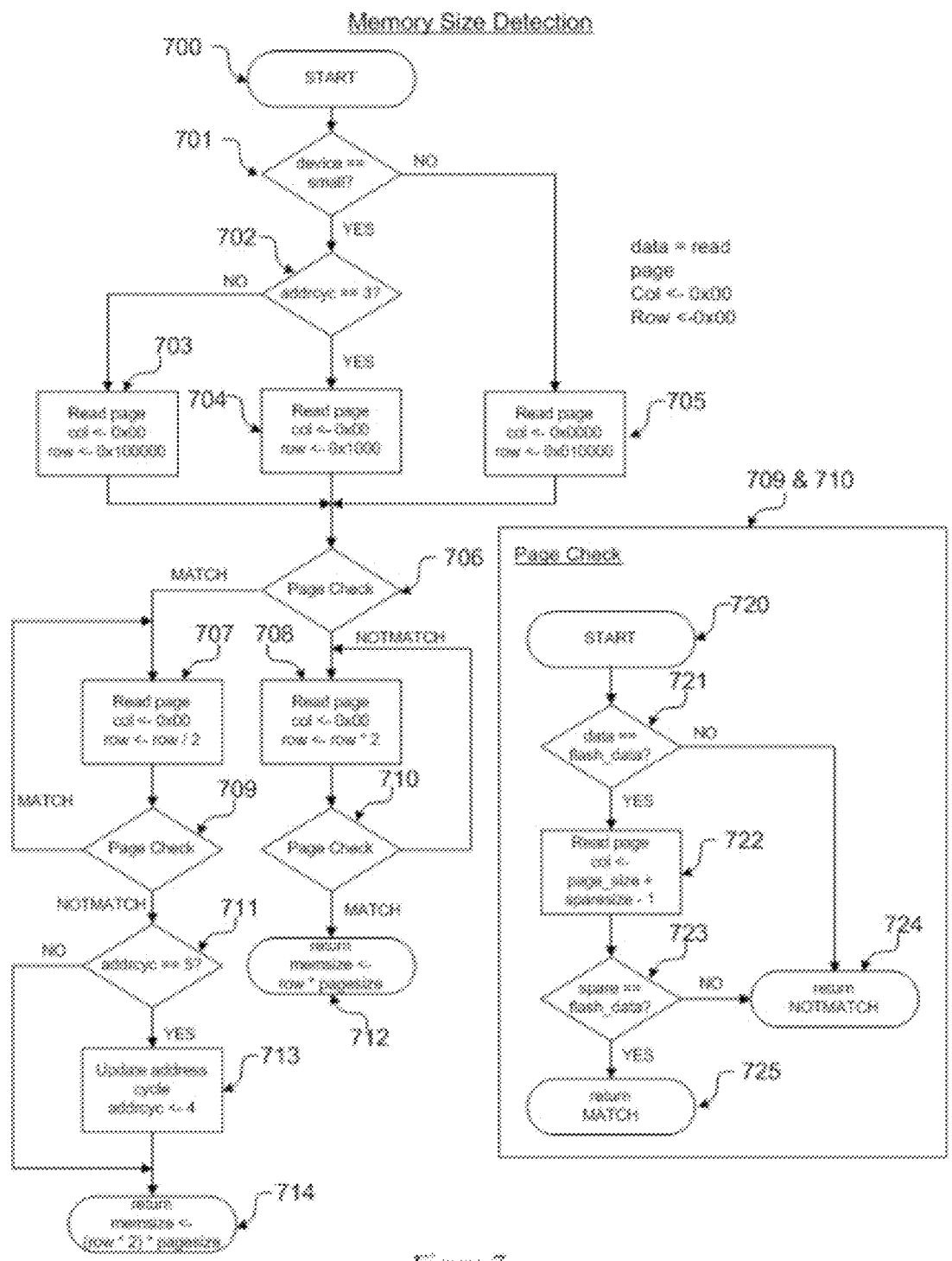
FIG. 7 shows a process flow diagram illustrating the process steps of the memory size detection of the NAND flash parameter automatic detection.

Referring to FIG. 7. Detecting a memory size of the NAND flash memory device begins with steps 701 and 702: deciding on the execution path based on the block type and address cycle of the NAND flash memory device; steps 703, 704, and 705: reading a page starting at the beginning of the page and a first row address, wherein beginning of the page has a column address of 0x00 for small block type with address cycle 3 or 4, and 0x0000 for large block type, and wherein the first row address is 0x100000 for small block type address cycle 4, 0x1000 for address cycle 3, and 0x010000 for large block type; step 706: executing a page check sub-process; if the page check sub-process results in a data match, then executing the branch starting from step 707; otherwise executing the following steps 708, 710, and 712: step 708: assigning a row address counter initially to the first row address, doubling the row address counter, and reading a page starting at the beginning of the page and a second row address that is equal to the row address counter; if the page check sub-process in step 710 results in a data mismatch, then repeating from step 708; otherwise, recording result of value of the row address counter multiplied by the page size as the memory size in step 712. From step 707: assigning a row address counter initially to the first row address, halving the row address counter, and reading a page starting at the beginning of the page and a second row address that is equal to the row address counter; if the page check sub-process in step 709 results in a data match, then repeating from step 707; otherwise if the address cycle is five in step 711, recording four as the address cycle in step 713 and recording result of two times value of the row address counter multiplied by the page size as the memory size in step 714.

The page check sub-process in steps 709 and 710 comprises step 721: determining if data read by the immediate preceding read is same as data read from a page starting at column address zero and row address zero, if not returning a result of data mismatch in step 724; otherwise, proceeding with step 722: reading a byte starting at a column address that is equal to the page size plus the spare size less one unit of memory address and a row address that is equal to the row address counter, which is the last byte in the spare memory space of the page corresponding to the row address counter, into a temporary data holder; in step 723, if data in the temporary data holder is not same as data read from a spare memory space of a page starting at a column address that is equal to the page size plus the spare size less one unit of memory address and row address zero, which is the last byte in the spare memory space of the page corresponding to the row address zero, then returning a result of data mismatch in step 724; otherwise, returning a result of data match in step 725.

Figure 8:
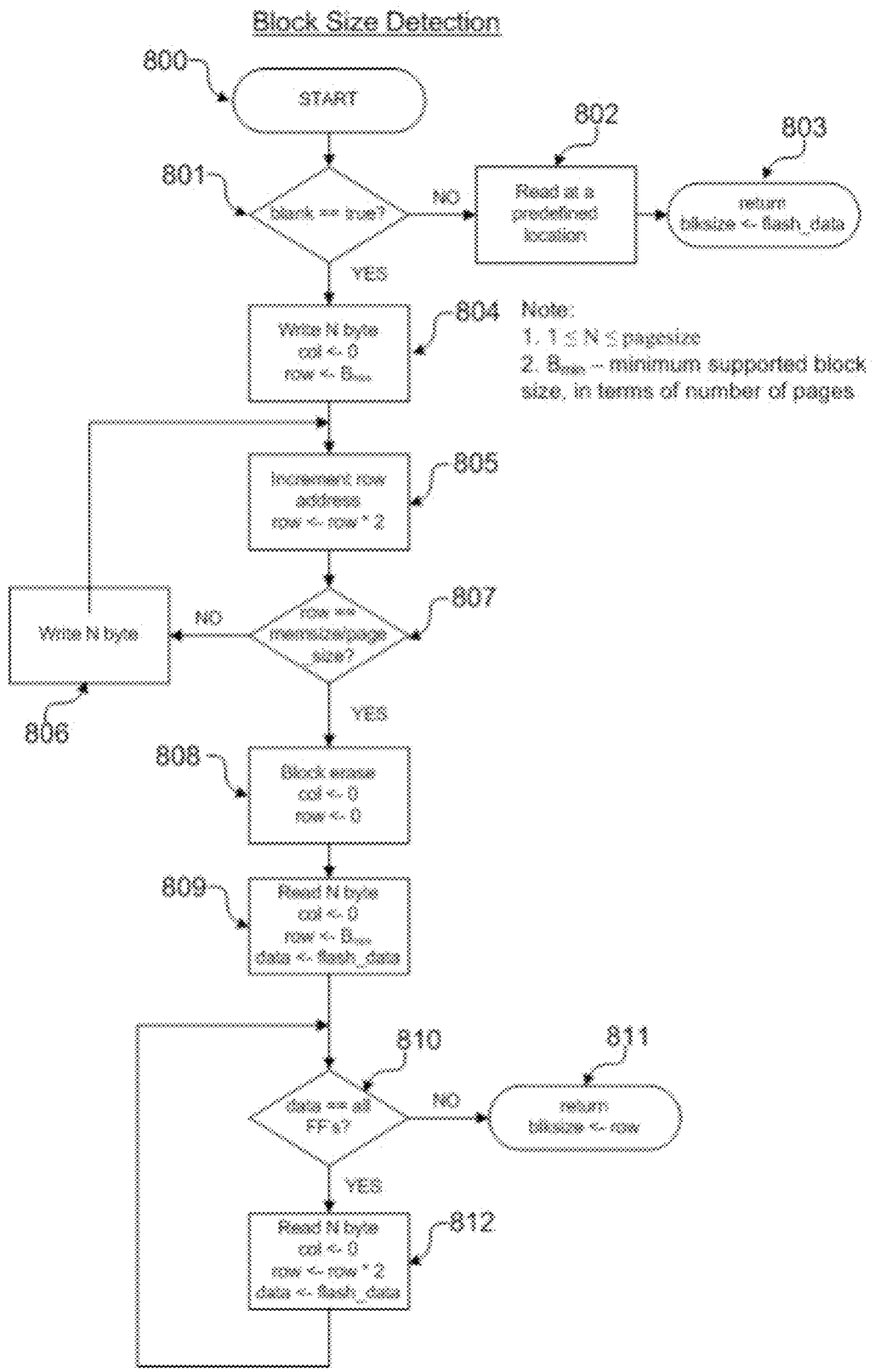
FIG. 8 shows a process flow diagram illustrating the process steps of the block size detection of the NAND flash parameter automatic detection.
Figure 9:
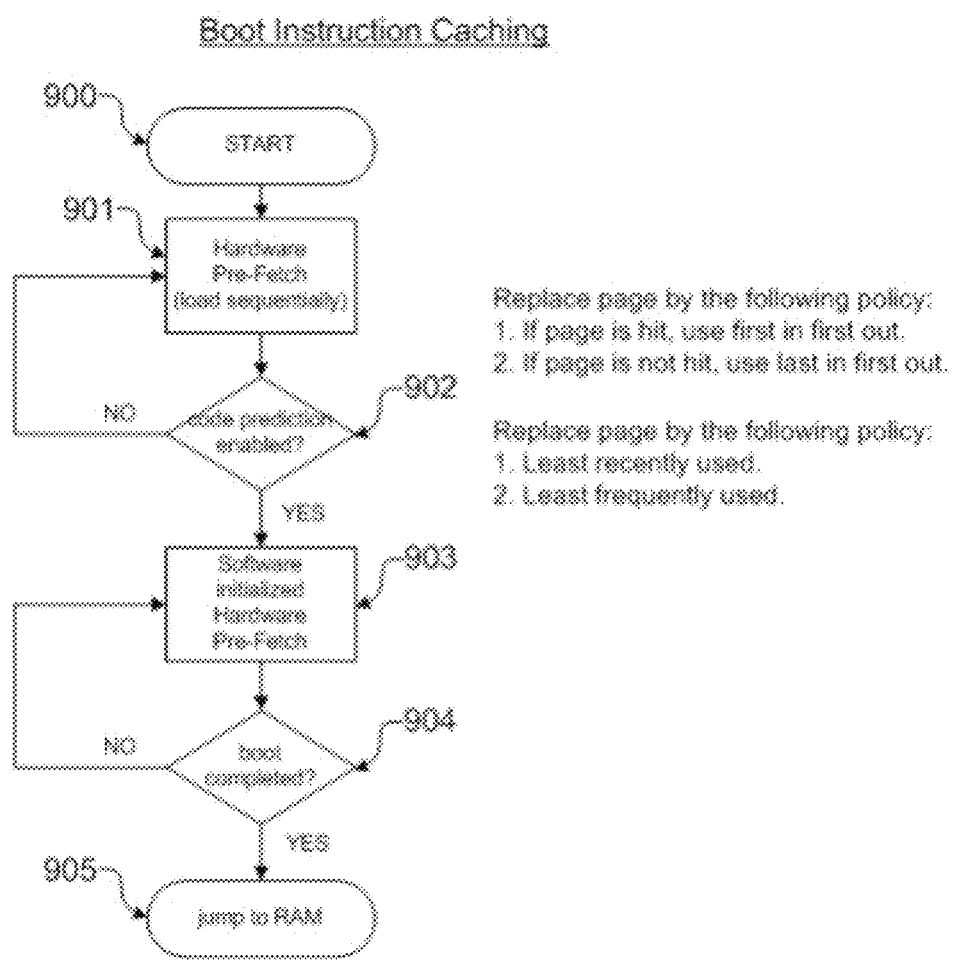
FIG. 9 shows a sequence of cache management of system boot instruction codes.
Figure 10:
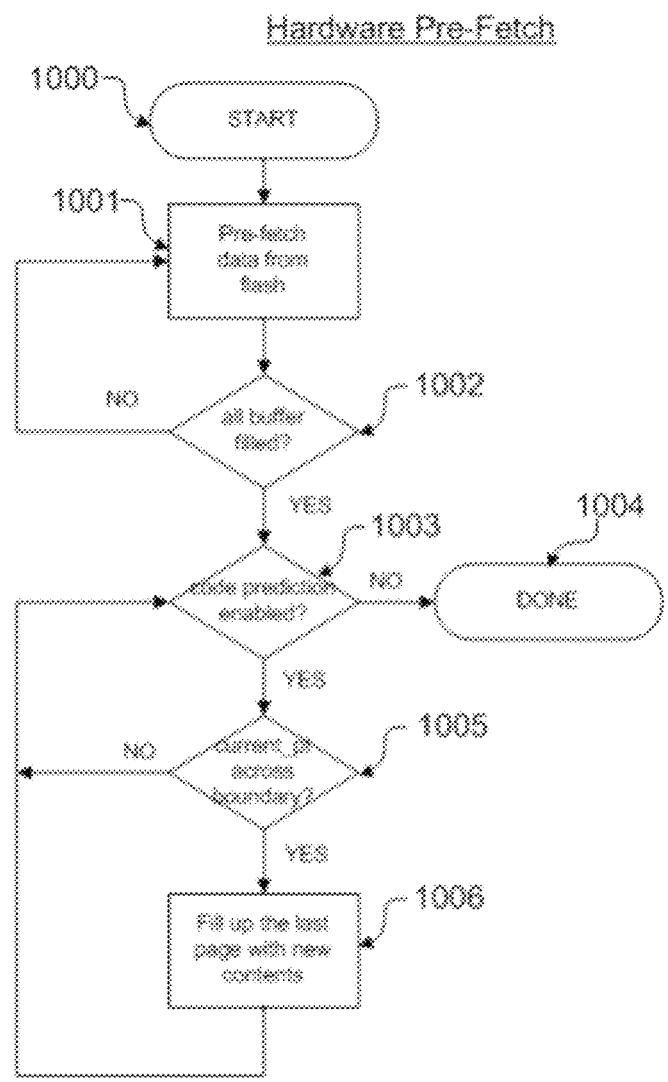
FIG. 10 shows a process flow diagram illustrating the process steps of hardware pre-fetching of system boot instruction codes.

Referring to FIG. 8. Detecting a block size of the NAND flash memory device begins with step 801 deciding on the execution path based on the whether the NAND flash memory device is blank; if the NAND flash memory device is not blank, then recording an extracted flash data read at a predefined memory location of the NAND flash memory device as the block size in steps 802 and 803; otherwise executing the following path: step 804: assigning a row address counter initially to a minimum supported block size, writing a N number of bytes of random data to the NAND flash memory device starting at column address zero and the row address that is equal to the row address counter, wherein N is a number between 1 and the page size inclusive; step 805: doubling the row address counter; step 807: checking if the row address counter is equal to the memory size divided by the page size; if not, then writing N number of bytes of random data to the NAND flash memory device and repeating from step 805; step 808: issuing a block erase command to the NAND flash memory device starting at column address zero and row address zero; step 809: assigning the row address counter to the minimum supported block size ($B_{min}$), reading the same N number of bytes of data starting at column address zero and the row address that is equal to the row address counter into a temporary data holder; step 810: checking if the temporary data holder is holding empty data values (all 0xFF); if not, then recording the row address counter as the block size in step 811; otherwise step 812: doubling the row address counter, reading the same N number of bytes of data starting at column address zero and the row address that is equal to the row address counter into the temporary data holder, and repeating from step 810 onward.

Figure 1:
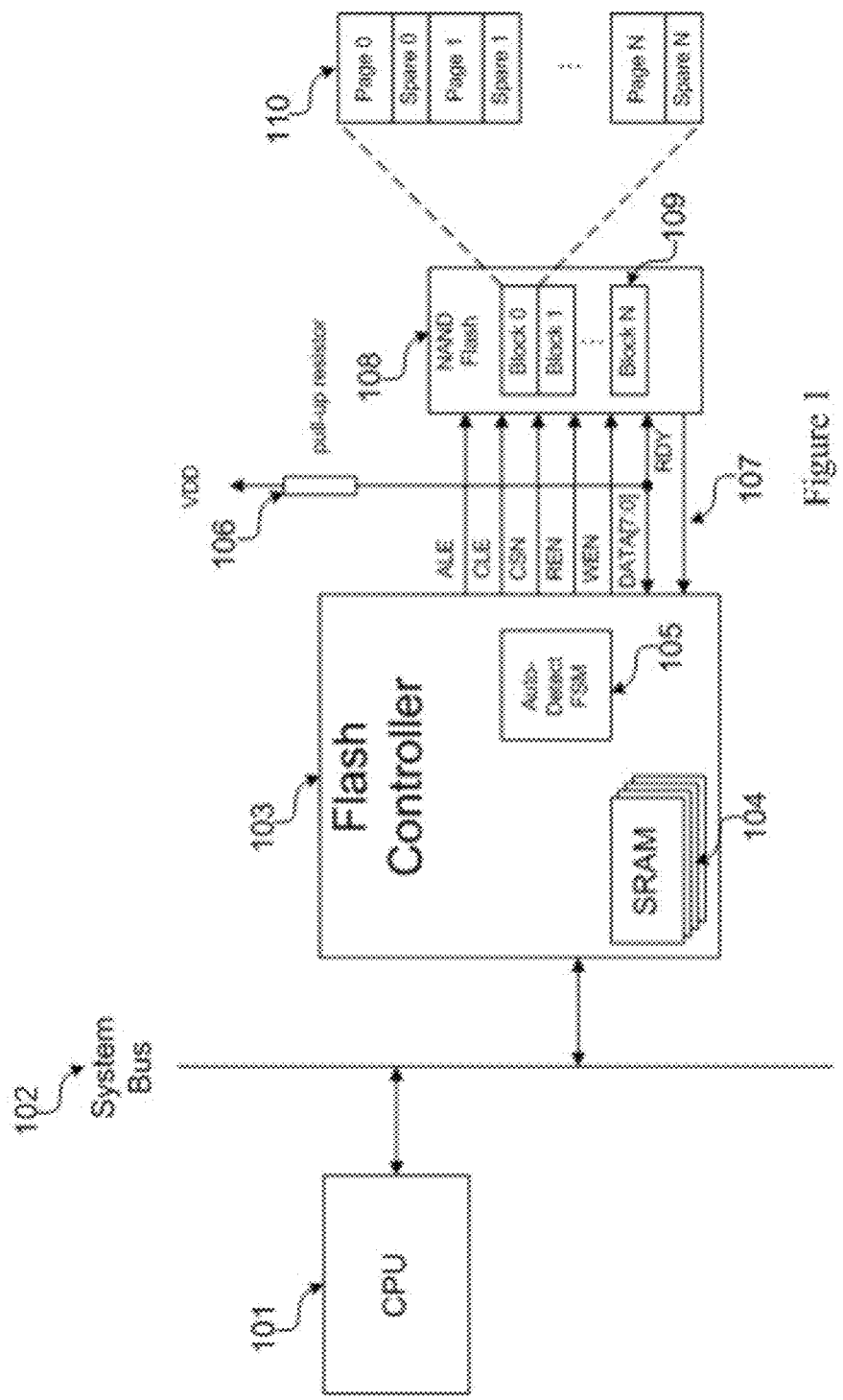
FIG. 1 shows a block diagram schematically illustrating a typical electronic or computer system comprising a central processing unit, a flash controller, and a NAND flash memory device.
Figure 2:
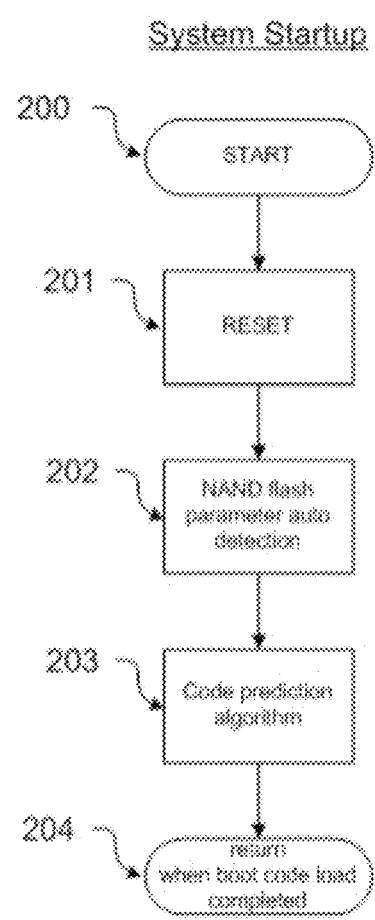
FIG. 2 shows a process flow diagram illustrating the overall system start up process of a system comprising a computer processor and a NAND flash memory using a NAND flash parameter automatic detection process and a code prediction algorithm.

The system boot instruction codes can be pre-loaded and cached in a flash controller's internal random access memory (RAM), such as the exemplary implementation of using a bank of SRAM, 104 as shown in FIG. 1, for faster delivery to a computer processor during system start up. Because the system boot instruction codes are typically larger in size than the flash memory controller's internal RAM, only a sub-set of the system boot instruction codes is cached at any point of time.

The code prediction algorithm makes a prediction of which sub-set of the system boot instruction codes will be executed imminently and pre-fetches such sub-set into the cache replacing the currently occupying codes that are least recently accessed or least frequently accessed. The cache is partitioned into pages, each is loaded with a section of the system boot instruction codes. The section that is under current execution will then request the flash memory controller to pre-fetch and load into other cache partitions other sections that will be executed imminently. Only a partition containing a section of boot instruction codes that is not under current execution will be replaced.

Figure 11:
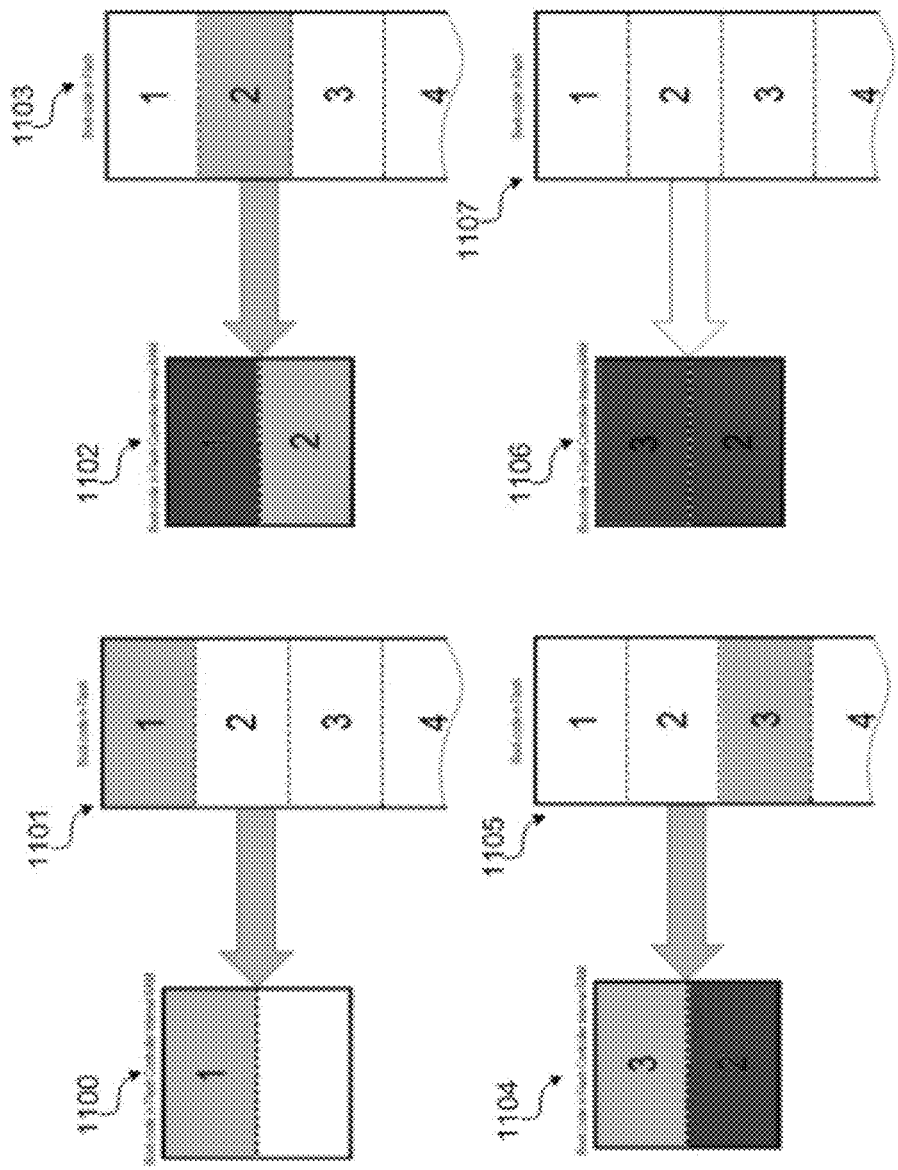
FIG. 11 shows a block diagram schematically illustrating an example of code prediction.

FIG. 11 shows a block diagram schematically illustrating an exemplary embodiment of the code prediction algorithm. The flash controller's internal RAM, serves as the cache memory, is partitioned into two pages. The system boot instruction codes contain four sections, and the execution sequence is that Section 1 is first execute, followed by Sections 2, then 3, then 2, then 3, and ended with 2. Information of the execution sequence of the code sections can be interspersed within the codes, such that the processor can instruct the flash controller to pre-fetch the next code sections while one section of the codes with the information of execution sequence is being executed. As shown in block 1100, the cache memory is initially loaded with Section 1 into the top page. The execution of Section 1 will reveal Section 2 to be executed next and instruct the flash controller to pre-fetch Section 2 into the bottom page of the cache memory as shown in block 1102. When Section 2 is being executed, Section 3 will be pre-fetched into the top page, replacing the idling Section 1 as shown in block 1104. Since no section other than 2 and 3 is predicted to be executed imminently, pre-fetching will be paused as shown in block 1106.

Figure 12:
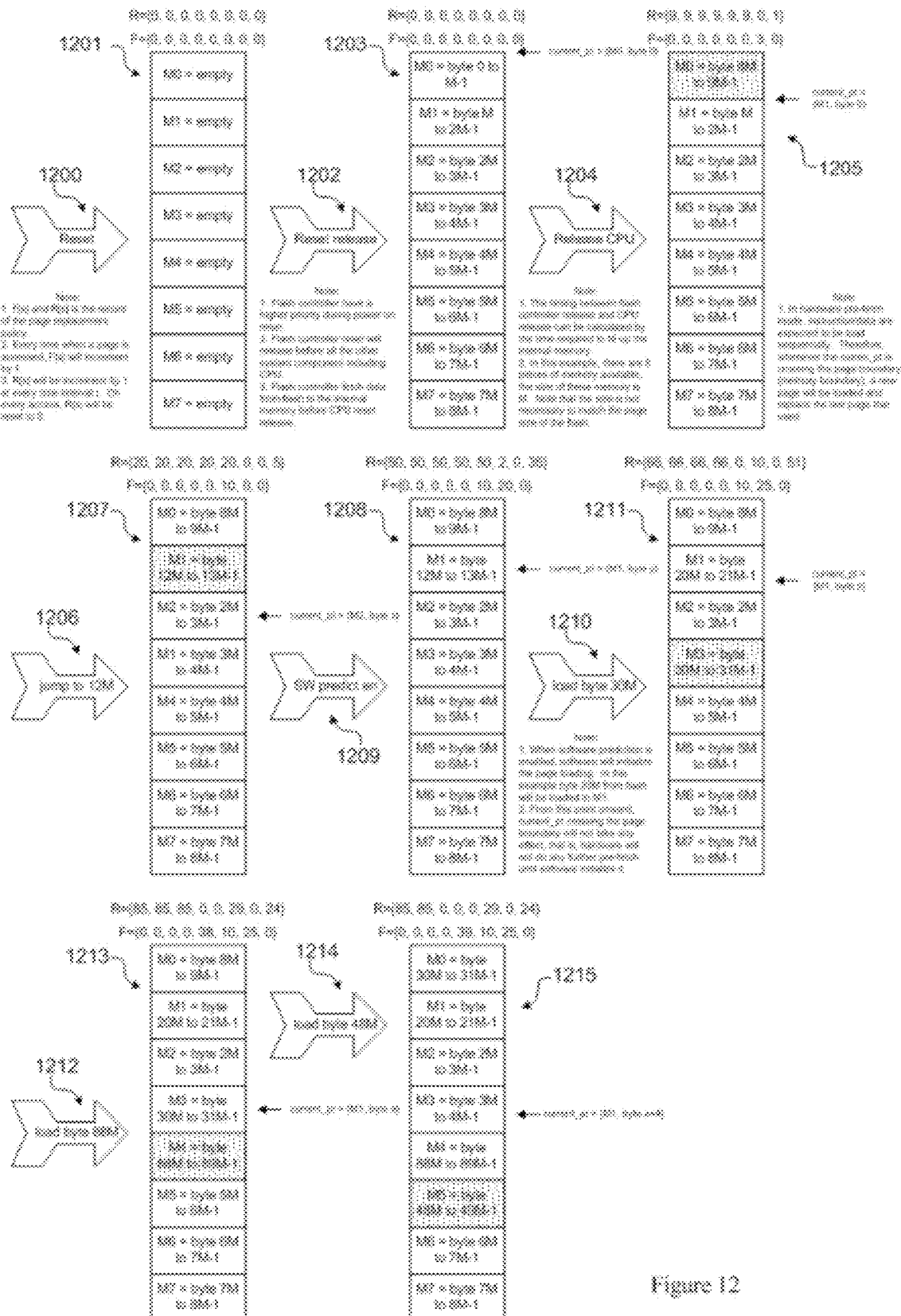
FIG. 12 shows a block diagram schematically illustrating another example of code prediction.

FIG. 12 shows a block diagram schematically illustrating another exemplary embodiment of the code prediction algorithm. Here, the cache memory is partitioned into eight pages. The priority order of replacing the contents in the particular pages is based on the two page-replacement policies associated with each page:

F[x] and R[x], where x is the particular page associated with.

Everytime the data or codes in page x is accessed or executed, F[x] is incremented by 1.

R[x] is incremented by 1 at every time interval t. On every access of page x, R[x] is reset to 0.

Thus, F[x] represents the access frequency of page x. The lower this number in relative to those of other pages, the more likely for page x to be replaced with new content when a new section of codes is to be cached. On the other hand, R[x] represents how recently page x has been accessed. The larger this number in relative to those of other pages means page x is less recently accessed compared to the others and more likely to be replaced with new content when a new section of codes is to be cached.

The embodiments disclosed herein may be implemented using a general purpose or specialized computing device, computer processor, or electronic circuitry including but not limited to a digital signal processor (DSP), application specific integrated circuit (ASIC), a field programmable gate array (FPGA), and other programmable logic device configured or programmed according to the teachings of the present disclosure. Computer instructions or software codes running in the general purpose or specialized computing device, computer processor, or programmable logic device can readily be prepared by partitioners skilled in the software or electronic art based on the teachings of the present disclosure.

In some embodiments, the present invention includes a computer storage medium having computer instructions or software codes stored therein which can be used to program a computer or microprocessor to perform any of the processes of the present invention. The storage medium can include, but is not limited to, floppy disks, optical discs, Blu-ray Disc, DVD, CD-ROMs, and magneto-optical disks, ROMs, RAMs, flash memory devices, or any type of media or device suitable for storing instructions, codes, and/or data.

The foregoing description of the present invention has been provided for the purposes of illustration and description. It is not intended to be exhaustive or to limit the invention to the precise forms disclosed. Many modifications and variations will be apparent to the practitioner skilled in the art.

The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

What is claimed is:

1. A system comprising:
   a NAND flash memory device having a multiplicity of parameters;
   a controller module configured to perform a NAND flash memory parameter detection process comprising:
   reading a device identifier of the NAND flash memory device and proceeding if a valid device identifier value is returned;
   detecting an address cycle and a block type of the NAND flash memory device;
   detecting a page size of the NAND flash memory device;
   detecting a spare size of the NAND flash memory device;
   detecting a memory size of the NAND flash memory device; and
   detecting a block size of the NAND flash memory device.

2. The system of claim 1, wherein said detecting an address cycle and a block type of the NAND flash memory device comprises:
   (1) issuing a first read command to the NAND flash memory device;
   (2) issuing three address bytes to the NAND flash memory device;
   (3) monitoring a busy signal from the NAND flash memory device for a wait time period of not less than a minimum wait time and not more than a maximum wait time;
   (4) if the busy signal is received within the wait time period, recording three for the address cycle and small for the block type;
   (5) otherwise, issuing one more address byte to the NAND flash memory device and monitoring the busy signal from the NAND flash memory device for the wait time period;
   (6) if the busy signal is received within the wait time period, recording four for the address cycle and small for the block type;
   (7) otherwise, issuing one more address byte to the NAND flash memory device, issuing a second read command to the NAND flash memory device, and recording five for the address cycle and large for the block type.

3. The system of claim 1, wherein said detecting a page size of the NAND flash memory device comprises:
(1) reading a first number of bytes of data from beginning of a page starting into a first temporary data holder;
(2) if the first temporary data holder is holding empty data values, then recording that the NAND flash memory device is blank, writing the first number of bytes of random data to the page and reading the first number of bytes of data from the page into the first temporary data holder;
(3) assigning a first column address counter initially to two times of a minimum supported page size;
(4) reading the first number of bytes of data from the page starting at a first column address that is equal to the first column address counter and comparing with data in the first temporary data holder;
(5) if the first number of bytes of data read from the page starting at the first column address that is equal to the first column address counter are same as the data in the first temporary data holder, then recording the first column address counter value times two as the page size if the block type is small and recording the first column address counter value divided by two as the page size if the block type is large;
(6) otherwise, assigning the first column address counter to two times its existing value and repeating from above (4) onward.

4. The system of claim 1, wherein said detecting a spare size of the NAND flash memory device comprises:
(1) if the block type of the NAND flash memory device is small, then executing the following:
(i) assigning a second column address counter initially to the page size plus a minimum supported spare size minus one unit of memory address,
(ii) reading a second number of bytes of data from the page starting with the second column address that is equal to the second column address counter,
(iii) monitoring the busy signal from the NAND flash memory device for the wait time period of no less than the minimum wait time and no more than the maximum wait time,
(iv) if the busy signal is received within the wait time period, recording the second column address counter minus the page size plus one unit of memory address as the spare size,
(v) otherwise if the busy signal is not received within the wait time period, then incrementing the second column address counter by one unit of memory address and repeating from above (1)(ii) onward;
(2) otherwise if the NAND flash memory device is not blank, then recording an extracted flash data read at a predefined memory location of the NAND flash memory device as the spare size;
(3) otherwise if the block type is large and if the NAND flash memory device is blank, then executing the following:
(i) assigning a third column address counter initially to the page size plus a minimum supported spare size minus one unit of memory address,
(ii) writing a third number of bytes of random data to a page starting at a third column address that is equal to the third column address counter, wherein the third number of bytes equaling a maximum supported spare size minus the minimum supported spare size plus one unit of memory address,
(iii) reading the third number of bytes of data from the page starting at the third column address that is equal to the third column address counter into a second temporary data holder,
(iv) incrementing the third column address counter by one unit of memory address,
(v) reading a byte from the page starting at the third column address that is equal to the third column address counter and comparing with a corresponding byte in the second temporary data holder,
(vi) if the byte read from the page starting at the third column address that is equal to the third column address counter is same as the corresponding byte in the second temporary data holder, then recording the third column address counter minus the page size plus one unit of memory address as the spare size,
(vii) otherwise, incrementing the third column address counter by one memory address unit and repeating from above (3)(v) onward.

5. The system of claim 1, wherein said detecting a memory size of the NAND flash memory device comprises:
(1) reading a page starting at beginning of the page and a first row address;
(2) executing a page check sub-process;
(3) if the page check sub-process results in a data match, then executing from below (5) onward;
(4) executing the following:
(i) assigning a first row address counter initially to the first row address,
(ii) doubling the first row address counter,
(iii) reading a page starting at beginning of the page and a second row address that is equal to the first row address counter,
(iv) executing the page check sub-process,
(v) if the page check sub-process results in a data mismatch, then repeating from above (4)(ii),
(vi) otherwise, recording result of value of the first row address counter multiplied by the page size as the memory size;
(5) otherwise, executing the following:
(i) assigning a first row address counter initially to the first row address,
(ii) halving the first row address counter,
(iii) reading a page starting at beginning of the page and a second row address that is equal to the first row address counter,
(iv) executing the page check sub-process, and if the page check sub-process results in a data match, then repeating from above (5)(ii),
(v) otherwise if the address cycle is five, then recording four as the address cycle, and
(vi) recording result of two times value of the first row address counter multiplied by the page size as the memory size.

6. The system of claim 5, wherein said page check sub-process comprises:
(1) if data read by the immediate preceding read is not same as data read from a page starting at column address zero and row address zero, then returning a result of data mismatch;
(2) otherwise, reading a byte starting at a column address that is equal to the page size plus the spare size less one unit of memory address and a row address that is equal to the first row address counter into a third temporary data holder;
(3) if data in the third temporary data holder is not same as data read from a spare memory space of a page starting at a column address that is equal to the page size plus the spare size less one unit of memory address and row address zero, then returning a result of data mismatch;
(4) otherwise, returning a result of data match.

7. The system of claim 1, wherein said detecting a block size of the NAND flash memory device comprises:
(1) if the NAND flash memory device is not blank, then recording an extracted flash data read at a predefined memory location of the NAND flash memory device as the block size;
(2) otherwise executing the following:
  (i) assigning a second row address counter initially to a minimum supported block size,
  (ii) writing a fourth number of bytes of random data to the NAND flash memory device starting at column address zero and a third row address that is equal to the second row address counter,
  (iii) doubling the second row address counter,
  (iv) if the second row address counter is not equal to the memory size divided by the page size, then repeating from above (2)(ii),
  (v) issuing a block erase command to the NAND flash memory device starting at column address zero and row address zero,
  (vi) assigning the second row address counter to the minimum supported block size,
  (vii) reading the fourth number of bytes of data starting at column address zero and the third row address that is equal to the second row address counter into a fourth temporary data holder,
  (viii) if the fourth temporary data holder is not holding empty data values, then recording the second row address counter as the block size,
  (ix) otherwise, assigning the second row address counter to two times its existing value and repeating from above (2)(vii);
wherein the fourth number of bytes is equal or larger than one but equal or less than the page size.

8. The system of claim 1, said NAND flash memory parameter detection process further comprising:
storing said address cycle, said block type, said page size, said spare size, and said block size in a cache.

9. A computer processor implementable method of detecting a plurality of parameters of a NAND flash memory device, comprising:
reading a device identifier of the NAND flash memory device and proceeding if a valid device identifier value is returned;
detecting an address cycle and a block type of the NAND flash memory device;
detecting a page size of the NAND flash memory device;
detecting a spare size of the NAND flash memory device;
detecting a memory size of the NAND flash memory device; and
detecting a block size of the NAND flash memory device.

10. The method of claim 9, wherein said detecting an address cycle and a block type of the NAND flash memory device comprises:
(1) issuing a first read command to the NAND flash memory device;
(2) issuing three address bytes to the NAND flash memory device;
(3) monitoring a busy signal from the NAND flash memory device for a wait time period of not less than a minimum wait time and not more than a maximum wait time;
(4) if the busy signal is received within the wait time period, recording three for the address cycle and small for the block type;
(5) otherwise, issuing one more address byte to the NAND flash memory device and monitoring the busy signal from the NAND flash memory device for the wait time period;
(6) if the busy signal is received within the wait time period, recording four for the address cycle and small for the block type;
(7) otherwise, issuing one more address byte to the NAND flash memory device, issuing a second read command to the NAND flash memory device, and recording five for the address cycle and large for the block type.

11. The method of claim 9, wherein said detecting a page size of the NAND flash memory device comprises:
(1) reading a first number of bytes of data from beginning of a page starting into a first temporary data holder;
(2) if the first temporary data holder is holding empty data values, then recording that the NAND flash memory device is blank, writing the first number of bytes of random data to the page and reading the first number of bytes of data from the page into the first temporary data holder;
(3) assigning a first column address counter initially to two times of a minimum supported page size;
(4) reading the first number of bytes of data from the page starting at a first column address that is equal to the first column address counter and comparing with data in the first temporary data holder;
(5) if the first number of bytes of data read from the page starting at the first column address that is equal to the first column address counter are same as the data in the first temporary data holder, then recording the first column address counter value times two as the page size if the block type is small and recording the first column address counter value divided by two as the page size if the block type is large;
(6) otherwise, assigning the first column address counter to two times its existing value and repeating from above (4) onward.

12. The method of claim 9, wherein said detecting a spare size of the NAND flash memory device comprises:
(1) if the block type of the NAND flash memory device is small, then executing the following:
  (i) assigning a second column address counter initially to the page size plus a minimum supported spare size minus one unit of memory address,
  (ii) reading a second number of bytes of data from the page starting with the second column address that is equal to the second column address counter,
  (iii) monitoring the busy signal from the NAND flash memory device for the wait time period of no less than the minimum wait time and no more than the maximum wait time,
  (iv) if the busy signal is received within the wait time period, recording the second column address counter minus the page size plus one unit of memory address as the spare size,
  (v) otherwise if the busy signal is not received within the wait time period, then incrementing the second column address counter by one unit of memory address and repeating from above (1)(iii) onward;
(2) otherwise if the NAND flash memory device is not blank, then recording an extracted flash data read at a predefined memory location of the NAND flash memory device as the spare size;

(3) otherwise if the block type is large and if the NAND flash memory device is blank, then executing the following:
  (i) assigning a third column address counter initially to the page size plus a minimum supported spare size minus one unit of memory address,
  (ii) writing a third number of bytes of random data to a page starting at a third column address that is equal to the third column address counter, wherein the third number of bytes equaling a maximum supported spare size minus the minimum supported spare size plus one unit of memory address,
  (iii) reading the third number of bytes of data from the page starting at the third column address that is equal to the third column address counter into a second temporary data holder,
  (iv) incrementing the third column address counter by one unit of memory address,
  (vi) reading a byte from the page starting at the third column address that is equal to the third column address counter and comparing with a corresponding byte in the second temporary data holder,
  (vi) if the byte read from the page starting at the third column address that is equal to the third column address counter is same as the corresponding byte in the second temporary data holder, then recording the third column address counter minus the page size plus one unit of memory address as the spare size,
  (vii) otherwise, incrementing the third column address counter by one memory address unit and repeating from above (3)(vi) onward.

13. The method of claim 9, wherein said detecting a memory size of the NAND flash memory device comprises:
  (1) reading a page starting at beginning of the page and a first row address;
  (2) executing a page check sub-process;
  (3) if the page check sub-process results in a data match, then executing from below (5) onward;
  (4) executing the following:
    (i) assigning a first row address counter initially to the first row address,
    (ii) doubling the first row address counter,
    (iii) reading a page starting at beginning of the page and a second row address that is equal to the first row address counter,
    (iv) executing the page check sub-process,
    (v) if the page check sub-process results in a data mismatch, then repeating from above (4)(ii),
    (vi) otherwise, recording result of value of the first row address counter multiplied by the page size as the memory size;
  (5) otherwise, executing the following:
    (i) assigning a first row address counter initially to the first row address,
    (ii) halving the first row address counter,
    (iii) reading a page starting at beginning of the page and a second row address that is equal to the first row address counter into a fourth temporary data holder,
    (iv) executing the page check sub-process, and if the page check sub-process results in a data match, then repeating from above (5)(ii),
    (v) otherwise if the address cycle is five, then recording four as the address cycle, and
    (vi) recording result of two times value of the first row address counter multiplied by the page size as the memory size.

14. The method of claim 13, wherein said page check sub-process comprises:
  (1) if data read by the immediate preceding read is not same as data in read from a page starting at column address zero and row address zero, then returning a result of data mismatch;
  (2) otherwise, reading a byte starting at a column address that is equal to the page size plus the spare size less one unit of memory address and a row address that is equal to the first row address counter into a third temporary data holder;
  (3) if data in the third temporary data holder is not same as data read from a spare memory space of a page starting at a column address that is equal to the page size plus the spare size less one unit of memory address and row address zero, then returning a result of data mismatch;
  (4) otherwise, returning a result of data match.

15. The system of claim 9, wherein said detecting a block size of the NAND flash memory device comprises:
  (1) if the NAND flash memory device is not blank, then recording an extracted flash data read at a predefined memory location of the NAND flash memory device as the block size;
  (2) otherwise executing the following:
    (i) assigning a second row address counter initially to a minimum supported block size,
    (ii) writing a fourth number of bytes of random data to the NAND flash memory device starting at column address zero and a third row address that is equal to the second row address counter,
    (iii) doubling the second row address counter,
    (iv) if the second row address counter is not equal to the memory size divided by the page size, then repeating from (2)(ii),
    (v) issuing a block erase command to the NAND flash memory device starting at column address zero and row address zero,
    (vi) assigning the second row address counter to the minimum supported block size,
    (vii) reading the fourth number of bytes of data starting at column address zero and the third row address that is equal to the second row address counter into a fourth temporary data holder, wherein the fifth number of bytes is equal to the page size,
    (viii) if the fourth temporary data holder is not holding empty data values, then recording the second row address counter as the block size,
    (ix) otherwise, assigning the second row address counter to two times its existing value and repeating from above (2)(vii);
  wherein the fourth number of bytes is equal or larger than one but equal or less than the page size.

16. The method of claim 9, further comprising:
  storing said address cycle, said block type, said page size, said spare size, and said block size in a cache.

17. A computer processor implementable method of caching computer instruction codes loaded from a NAND flash memory device, comprising:
  detecting a plurality of parameters of the NAND flash memory device according to the method of claim 9, whereby the parameters are used in loading the computer instructions codes from the NAND flash memory device;

partitioning a cache memory into a plurality of pages;

from the NAND flash memory device, loading into a first memory page with a first section of computer instruction codes that is to be executed immediately by a computer processor;

determining, according to a section of computer instruction codes currently under execution, next one or more sections of computer instruction codes that will be executed imminently;

loading, from the NAND flash memory device, the next one or more sections of computer instruction codes that will be executed imminently, and replacing one or more currently cached one or more sections of computer instruction codes in a second group of one or more pages;

repeating the determination of the next one or more sections of computer instruction codes that will be executed imminently, the loading of the next one or more sections that will be executed imminently, and replacing the currently cached one or more sections of computer instruction codes in the second group of one or more pages until all sections of the computer instruction codes have been executed.

18. The method of claim 17, said second group of one or more pages is selected such that any section of computer instruction codes currently cached within is not being currently executed.

19. The method of claim 17, said second group of one or more pages is selected such that the one or more sections of computer instruction codes currently cached within are least recently executed.

20. The method of claim 17, said second page is selected such that the one or more sections of computer instruction codes currently cached within are least frequently executed.

* * * * *